US008142051B2

(12) United States Patent
Ducharme

(10) Patent No.: US 8,142,051 B2
(45) Date of Patent: Mar. 27, 2012

(54) SYSTEMS AND METHODS FOR CONVERTING ILLUMINATION

(75) Inventor: Alfred D. Ducharme, Orlando, FL (US)

(73) Assignee: Philips Solid-State Lighting Solutions, Inc., Burlington, MA (US)

( * ) Notice: Subject to any disclaimer, the term of this patent is extended or adjusted under 35 U.S.C. 154(b) by 1150 days.

(21) Appl. No.: 11/553,512

(22) Filed: Oct. 27, 2006

(65) Prior Publication Data

US 2007/0047227 A1 Mar. 1, 2007

Related U.S. Application Data

(60) Division of application No. 10/935,329, filed on Sep. 7, 2004, now Pat. No. 7,132,785, which is a continuation of application No. 10/113,834, filed on Apr. 1, 2002, now abandoned, and a continuation-in-part of application No. 09/716,819, filed on Nov. 20, 2000, now Pat. No. 7,014,336.

(60) Provisional application No. 60/280,215, filed on Mar. 30, 2001, provisional application No. 60/166,533, filed on Nov. 18, 1999, provisional application No. 60/235,678, filed on Sep. 27, 2000, provisional application No. 60/201,140, filed on May 2, 2000.

(51) Int. Cl.
*F21S 4/00* (2006.01)
*H01L 33/50* (2010.01)
*F21V 9/00* (2006.01)

(52) U.S. Cl. ......... 362/249.02; 362/249.06; 362/311.02; 362/555; 362/230; 313/501; 313/485

(58) Field of Classification Search .................. 313/501, 313/512, 485–487; 257/98–100; 362/249.05, 362/500, 545, 800, 612, 311.02
See application file for complete search history.

(56) References Cited

U.S. PATENT DOCUMENTS 1,324,008 A 12/1919 D'Humy
2,135,480 A 11/1938 Birdseye
2,769,897 A 12/1954 Rzeszutko
2,725,461 A 11/1955 Amour
3,201,576 A 8/1965 Scott
3,644,785 A 2/1972 Jarmar
3,696,263 A 10/1972 Wacher
3,875,456 A 4/1975 Kano et al.
4,045,664 A 8/1977 Vrenken et al.
4,641,227 A 2/1987 Kusuhara
4,947,291 A 8/1990 McDermott
4,962,687 A 10/1990 Belliveau et al.

(Continued)

FOREIGN PATENT DOCUMENTS

CH 253968 12/1948

(Continued)

OTHER PUBLICATIONS

ARI International, "LED White Caps," www.ari-corp.com, 2002.

(Continued)

*Primary Examiner* — Mariceli Santiago

(57) ABSTRACT

An illumination system according to the principles of the invention may include a first LED and a carrier material. The carrier material may be comprised of plastic, synthetic material, polymer, latex, rubber or other material. The carrier material may also contain a phosphor, fluorescent material, organic fluorescent material, inorganic fluorescent material, impregnated phosphor, phosphor particles, phosphor material, YAG:Ce phosphor, or other material for converting electromagnetic radiation into illumination or visible light.

38 Claims, 4 Drawing Sheets

U.S. PATENT DOCUMENTS 5,060,118 A 10/1991 Penrod
5,136,483 A 8/1992 Schöniger et al.
5,217,285 A 6/1993 Sopori
5,278,610 A 1/1994 Ishiwatari et al.
5,301,090 A 4/1994 Hed
5,350,977 A 9/1994 Hamamoto et al.
5,384,519 A 1/1995 Gotoh
5,388,357 A 2/1995 Malita
5,418,697 A 5/1995 Chiou
5,515,136 A 5/1996 Nishio
5,544,037 A 8/1996 Luger
5,577,832 A 11/1996 Lodhie
5,607,227 A 3/1997 Yasumoto et al.
5,642,933 A 7/1997 Hitora
5,653,529 A 8/1997 Spocharski
5,655,830 A 8/1997 Ruskouski
5,682,035 A 10/1997 Gallagher et al.
5,684,309 A 11/1997 McIntosh et al.
5,688,042 A 11/1997 Madadi et al.
5,707,139 A 1/1998 Haitz
5,721,471 A 2/1998 Begemann et al.
5,749,646 A 5/1998 Brittell
5,803,579 A 9/1998 Turnbull et al.
5,803,592 A 9/1998 Lawson
5,806,965 A 9/1998 Deese
5,813,753 A 9/1998 Vriens
5,836,676 A 11/1998 Ando et al.
5,851,063 A 12/1998 Doughty et al.
5,887,968 A 3/1999 Logan
5,949,581 A 9/1999 Kurtenbach et al.
5,959,316 A 9/1999 Lowery
5,982,957 A 11/1999 DeCaro
5,982,969 A 11/1999 Sugiyama et al.
5,998,925 A 12/1999 Shimizu et al.
6,016,038 A 1/2000 Mueller et al.
6,028,694 A 2/2000 Schmidt
6,056,420 A 5/2000 Wilson et al.
6,066,861 A 5/2000 Höhn et al.
6,068,383 A * 5/2000 Robertson et al. .............. 362/84
6,126,303 A * 10/2000 Gross ............................ 362/544
6,127,783 A 10/2000 Pashley et al.
6,132,072 A 10/2000 Turnbull et al.
6,150,774 A 11/2000 Mueller et al.
6,158,882 A * 12/2000 Bischoff, Jr. .................. 362/488
6,161,941 A 12/2000 Tait
6,166,496 A 12/2000 Lys et al.
6,183,086 B1 2/2001 Neubert
6,183,102 B1 * 2/2001 Mortz et al. .................... 362/84
6,183,104 B1 2/2001 Ferrara
6,183,108 B1 2/2001 Herold
6,211,626 B1 4/2001 Lys et al.
6,212,213 B1 4/2001 Weber et al.
6,234,645 B1 5/2001 Borner et al.
6,234,648 B1 * 5/2001 Borner et al. ................. 362/235
6,235,648 B1 5/2001 Mizuhara et al.
6,245,259 B1 6/2001 Höhn et al.
6,252,254 B1 6/2001 Soules et al.
6,255,670 B1 7/2001 Srivastava et al.
6,259,430 B1 7/2001 Riddle et al.
6,277,301 B1 8/2001 Höhn et al.
6,283,612 B1 9/2001 Hunter
6,292,901 B1 9/2001 Lys et al.
6,294,800 B1 9/2001 Duggal et al.
6,299,329 B1 10/2001 Mui
6,299,338 B1 10/2001 Levinson et al.
6,340,868 B1 1/2002 Lys et al.
6,357,889 B1 * 3/2002 Duggal et al. .................. 362/84
6,357,893 B1 3/2002 Belliveau
6,361,186 B1 3/2002 Slayden
6,379,022 B1 4/2002 Amerson et al.
6,386,720 B1 5/2002 Mochizuki
6,411,046 B1 6/2002 Muthu
6,441,558 B1 8/2002 Muthu et al.
6,450,664 B1 * 9/2002 Kelly ............................ 362/244
6,459,919 B1 10/2002 Lys et al.
6,474,837 B1 11/2002 Belliveau
6,508,564 B1 1/2003 Kuwabara et al.
6,528,954 B1 3/2003 Lys et al.
6,548,967 B1 4/2003 Dowling et al.
6,550,952 B1 4/2003 Hulse et al.
6,557,282 B1 5/2003 Cleaver
6,568,834 B1 5/2003 Scianna
6,573,949 B1 6/2003 Yamamoto
6,576,930 B2 6/2003 Reeh et al.
6,577,073 B2 6/2003 Shimizu et al.
6,577,080 B2 6/2003 Lys et al.
6,583,550 B2 * 6/2003 Iwasa et al. ................... 313/485
6,592,238 B2 7/2003 Cleaver et al.
6,592,780 B2 7/2003 Höhn et al.
6,608,453 B2 8/2003 Morgan et al.
6,609,813 B1 8/2003 Showers et al.
6,624,597 B2 9/2003 Dowling et al.
6,630,801 B2 10/2003 Schuurmans
6,692,136 B2 2/2004 Marshall et al.
6,717,376 B2 4/2004 Lys et al.
6,720,745 B2 4/2004 Mueller et al.
6,726,350 B1 4/2004 Herold
6,762,562 B2 7/2004 Leong
6,774,584 B2 8/2004 Lys et al.
6,777,891 B2 8/2004 Lys et al.
6,781,329 B2 8/2004 Morgan et al.
6,788,011 B2 9/2004 Mueller et al.
6,801,003 B2 10/2004 Schanberger et al.
6,806,659 B1 10/2004 Mueller et al.
6,812,500 B2 11/2004 Reeh et al.
6,869,204 B2 3/2005 Morgan et al.
6,883,929 B2 4/2005 Dowling
6,888,322 B2 5/2005 Dowling et al.
6,897,624 B2 5/2005 Ducharme et al.
6,936,978 B2 8/2005 Morgan et al.
6,965,205 B2 11/2005 Piepgras et al.
6,967,448 B2 11/2005 Morgan et al.
6,969,954 B2 11/2005 Lys
6,975,079 B2 12/2005 Lys et al.
7,031,920 B2 4/2006 Dowling et al.
7,038,398 B1 5/2006 Lys et al.
7,038,399 B2 5/2006 Lys et al.
7,040,774 B2 5/2006 Beeson et al.
7,042,172 B2 5/2006 Dowling et al.
7,113,541 B1 9/2006 Lys et al.
7,144,131 B2 12/2006 Rains
7,213,940 B1 5/2007 Van De Ven et al.
2001/0033488 A1 10/2001 Chliwnyj et al.
2002/0038157 A1 3/2002 Dowling et al.
2002/0044066 A1 4/2002 Dowling et al.
2002/0047569 A1 4/2002 Dowling et al.
2002/0047624 A1 4/2002 Stam et al.
2002/0048169 A1 4/2002 Dowling et al.
2002/0057061 A1 5/2002 Mueller et al.
2002/0060526 A1 5/2002 Timmermans et al.
2002/0070688 A1 6/2002 Dowling et al.
2002/0074559 A1 6/2002 Dowling et al.
2002/0078221 A1 6/2002 Blackwell et al.
2002/0101197 A1 8/2002 Lys et al.
2002/0114155 A1 8/2002 Katogi et al.
2002/0130627 A1 9/2002 Dowling et al.
2002/0145394 A1 10/2002 Morgan et al.
2002/0145869 A1 10/2002 Dowling
2002/0152045 A1 10/2002 Dowling et al.
2002/0153851 A1 10/2002 Dowling et al.
2002/0158583 A1 10/2002 Lys et al.
2002/0163316 A1 11/2002 Dowling et al.
2002/0171365 A1 11/2002 Morgan et al.
2002/0171377 A1 11/2002 Mueller et al.
2002/0171378 A1 11/2002 Morgan et al.
2002/0176259 A1 11/2002 Ducharme
2002/0186556 A1 12/2002 Wojnarowski
2002/0195975 A1 12/2002 Dowling et al.
2003/0011538 A1 1/2003 Lys et al.
2003/0021115 A1 1/2003 Sloan et al.
2003/0028260 A1 2/2003 Blackwell
2003/0048641 A1 3/2003 Alexanderson et al.
2003/0057884 A1 3/2003 Dowling et al.
2003/0057886 A1 3/2003 Lys et al.
2003/0057887 A1 3/2003 Dowling et al.
2003/0057890 A1 3/2003 Lys et al.
2003/0076281 A1 4/2003 Morgan et al.

| | | | |
|---|---|---|---|
| 2003/0100837 | A1 | 5/2003 | Lys et al. |
| 2003/0133292 | A1 | 7/2003 | Mueller et al. |
| 2003/0137258 | A1 | 7/2003 | Piepgras et al. |
| 2003/0198061 | A1 | 10/2003 | Chambers et al. |
| 2003/0222587 | A1 | 12/2003 | Dowling et al. |
| 2004/0032226 | A1 | 2/2004 | Lys |
| 2004/0036006 | A1 | 2/2004 | Dowling |
| 2004/0052076 | A1 | 3/2004 | Mueller et al. |
| 2004/0090191 | A1 | 5/2004 | Mueller et al. |
| 2004/0090787 | A1 | 5/2004 | Dowling et al. |
| 2004/0105261 | A1 | 6/2004 | Ducharme et al. |
| 2004/0116039 | A1 | 6/2004 | Mueller et al. |
| 2004/0130909 | A1 | 7/2004 | Mueller et al. |
| 2004/0178751 | A1 | 9/2004 | Mueller et al. |
| 2004/0212320 | A1 | 10/2004 | Dowling et al. |
| 2004/0212993 | A1 | 10/2004 | Morgan et al. |
| 2004/0218387 | A1 | 11/2004 | Gerlach |
| 2004/0264193 | A1 | 12/2004 | Okumura |
| 2005/0099824 | A1 | 5/2005 | Dowling et al. |
| 2005/0116667 | A1 | 6/2005 | Mueller et al. |
| 2005/0122293 | A1 | 6/2005 | Wang |
| 2005/0151489 | A1 | 7/2005 | Lys et al. |
| 2005/0213352 | A1 | 9/2005 | Lys et al. |
| 2005/0213353 | A1 | 9/2005 | Lys |
| 2005/0218838 | A1 | 10/2005 | Lys |
| 2005/0218870 | A1 | 10/2005 | Lys |
| 2005/0219872 | A1 | 10/2005 | Lys |
| 2005/0231133 | A1 | 10/2005 | Lys |
| 2005/0236029 | A1 | 10/2005 | Dowling |
| 2005/0236998 | A1 | 10/2005 | Mueller |
| 2005/0253533 | A1 | 11/2005 | Lys et al. |
| 2005/0275626 | A1 | 12/2005 | Mueller |
| 2005/0276053 | A1 | 12/2005 | Nortrup |
| 2006/0002110 | A1 | 1/2006 | Dowling |
| 2006/0012987 | A9 | 1/2006 | Ducharme |
| 2006/0016960 | A1 | 1/2006 | Morgan |
| 2006/0022214 | A1 | 2/2006 | Morgan |
| 2006/0050509 | A9 | 3/2006 | Dowling |
| 2006/0076908 | A1 | 4/2006 | Morgan |
| 2006/0098077 | A1 | 5/2006 | Dowling |
| 2006/0104058 | A1 | 5/2006 | Chemel et al. |
| 2006/0109649 | A1 | 5/2006 | Ducharme et al. |
| 2006/0132061 | A1 | 6/2006 | McCormick et al. |
| 2006/0152172 | A9 | 7/2006 | Mueller |
| 2006/0158881 | A1 | 7/2006 | Dowling |
| 2006/0198128 | A1 | 9/2006 | Piepgras et al. |
| 2006/0208667 | A1 | 9/2006 | Lys |
| 2008/0094835 | A1 | 4/2008 | Marra et al. |
| 2008/0106887 | A1 | 5/2008 | Salsbury et al. |

FOREIGN PATENT DOCUMENTS

| | | | | |
|---|---|---|---|---|
| DE | 01950581 | | | 10/1969 |
| DE | 02243245 | | | 9/1972 |
| DE | 03526590 | A1 | | 7/1985 |
| DE | 3526590 | A1 | | 1/1986 |
| DE | 19624087 | A1 | | 6/1996 |
| DE | 19638667 | A1 | | 9/1996 |
| DE | 29620583 | U1 | | 3/1997 |
| DE | 19624087 | A1 | | 12/1997 |
| DE | 19829270 | A1 | | 7/1998 |
| DE | 19829270 | A1 | | 1/1999 |
| DE | 20007134 | U1 | | 9/2000 |
| EP | 0490329 | A1 | | 6/1992 |
| EP | 0639938 | A1 | | 2/1995 |
| EP | 0689373 | A2 | | 12/1995 |
| EP | 0701390 | A2 | | 3/1996 |
| EP | 0838866 | A2 | | 4/1998 |
| EP | 0971421 | A2 | | 1/2000 |
| EP | 1160883 | A2 | | 5/2001 |
| EP | 1162400 | A2 | | 12/2001 |
| JP | 06-290876 | | | 10/1994 |
| JP | 07335942 | A | | 12/1995 |
| JP | 08-185986 | | | 7/1996 |
| JP | 08248901 | A | | 9/1996 |
| JP | 08293391 | A | | 11/1996 |
| JP | 08-007611 | | | 12/1996 |
| JP | 09-007774 | | | 1/1997 |
| JP | 09007774 | A | | 1/1997 |
| JP | 09167861 | A | | 6/1997 |
| JP | 10040702 | A | * | 2/1998 |
| JP | 10071951 | A | | 3/1998 |
| JP | 10189242 | A | * | 7/1998 |
| JP | 10242513 | A | | 9/1998 |
| JP | 10269822 | A | * | 10/1998 |
| JP | 11039917 | A | | 2/1999 |
| JP | 11087770 | A | | 3/1999 |
| JP | 11087774 | A | | 3/1999 |
| JP | 11-135274 | | | 5/1999 |
| JP | 11133891 | A | | 5/1999 |
| JP | 11-162660 | | | 6/1999 |
| JP | 11202330 | A | | 7/1999 |
| WO | WO 97/48138 | | | 12/1997 |
| WO | WO 00/14705 | | | 3/2000 |
| WO | WO 00/19141 | | | 4/2000 |
| WO | WO 00/33390 | | | 6/2000 |
| WO | WO 01/24229 | A2 | | 4/2001 |
| WO | WO 2006/016324 | A1 | | 2/2006 |

OTHER PUBLICATIONS

Bass, M, "Handbook of Optics," McGraw Hill, USA, 1995, p. 26.33.

Brainard David H., "Colorimetry", Chapter 26, US, New York, McGraw-Hill, pp. 2601-2654, 1995.

Ganslandt et al., "Handbuch der Lichtplanung," Vieweg + Sohn, Wiesbaden, 1992.

Girardet, V. W., "Handbuch fur Beleuchtung," Essen, Germany 1975.

Goldstein Michael, "The Smart House", Acura Style, www.acura.com, 2002.

iLight Technologies, "Curved or Straight in White or Color," 2004, www.ilight-tech.com/products.htm.

iLight Technologies, "Curved or Straight in White or Color," 2004, www.ilight-tech.com/products_white.htm.

iLight Technologies, "Explore the iLight Possibilities," 2004, www.ilight-tech.com.

Morrison David, "Brighter LEDs Signal Longer Life and Lower Power for Lighting Applications", www.planetee.com, 2002.

Munch, W., "Fortschritte in der Bewertung der Farbwiedergabe durch Lichtquellen." Tagungsbericht uber das IV, Internationale Kolloquium an der Hochschule fur Elektronik Ilmenau, Oct. 1959.

Nakamura, S., "The Blue Laser Diode," Seiten 7-10, pp. 216-221, Springer Verlag, Berlin, Germany, 1997.

Opposition Brief, May 10, 2006, by ERCO Leuchten GmbH, opposing European Patent No. 1234140, pp. 1-20.

Opposition Brief, May 10, 2006, by Koniklijke Philips Electronics N.V., opposing European Patent No. 1234140, pp. 1-24.

Opposition Brief, May 4, 2006, by Tridonic Atco GmbH and Co. KG, opposing European Patent No. 1234140, pp. 1-21.

Opposition Brief, May 8, 2006, by Osram GmbH, opposing European Patent No. 1234140, pp. 1-21.

Robert K. John, "Binary Complementary Synthetic-White LED Illuminators", SAE Technical Paper Series, presented at the International Congress and Exposition; Detroit, Michigan, Mar. 1-4, 1999.

Technical specification, LEDRA Display, Bruck Lighting Systems, 3505 Cadillace Ave. L-5, Costa Mesa, CA 92626, www.brucklighting.com, 1 page, 2002.

Technical specification, LEDRA I, Bruck Lighting Systems, 3505 Cadillace Ave. L-5, Costa Mesa, CA 92626, www.brucklighting.com, 1 page, 2002.

Technical specification, LEDRA II, Bruck Lighting Systems, 3505 Cadillace Ave. L-5, Costa Mesa, CA 92626, www.brucklighting.com, 1 page, 2002.

Technical specification, LEDRA R, Bruck Lighting Systems, 3505 Cadillace Ave. L-5, Costa Mesa, CA 92626, www.brucklighting.com, 1 page, 2002.

iLight Technologies, "Curved or Straight in White or Color," 2004, www.ilight-tech.com/products_color.htm.

iLight Technologies, "Curved or Straight in White or Color," 2004, www.ilight-tech.com/products_signs.htm.

* cited by examiner

SYSTEMS AND METHODS FOR CONVERTING ILLUMINATION

CROSS REFERENCES TO RELATED APPLICATIONS

This application is a divisional (DIV) of U.S. Non-provisional application Ser. No. 10/935,329, filed Sep. 7, 2004 now U.S. Pat. No. 7,132,785, entitled "Systems and Methods for Converting Illumination."

Ser. No. 10/935,329 is a continuation (CON) of U.S. Non-provisional application Ser. No. 10/113,834, filed Apr. 1, 2002 now abandoned, entitled "Systems and Methods for Converting Illumination."

Ser. No. 10/113,834 in turn claimed the benefit, under 35 U.S.C. §119(e), of U.S. provisional application Ser. No. 60/280,215, filed Mar. 30, 2001, entitled "Systems and Methods for Converting Illumination."

Ser. No. 10/113,834 also claimed the benefit, under 35 U.S.C. §120, as a continuation-in-part (CIP) of U.S. Non-provisional patent application Ser. No. 09/716,819, filed Nov. 20, 2000 now U.S. Pat. No. 7,014,336, entitled "Systems and Methods for Generating and Modulating Illumination Conditions."

Ser. No. 09/716,819 in turn claimed the benefit, under 35 U.S.C. §119(e), of the following U.S. provisional applications:

Ser. No. 60/166,533, filed Nov. 18, 1999, entitled "Designing Lights With LED Spectrum;

Ser. No. 60/235,678, filed Sep. 27, 2000, entitled "Ultraviolet Light Emitting Diode Device; and Ser. No. 60/201,140, filed May 2, 2000, entitled "Systems and Methods for Modulating Illumination Conditions.

Each of the foregoing applications hereby is incorporated herein by reference.

BACKGROUND

1. Field of the Invention

The present invention relates to light emitting diode devices. In particular the invention relates to illumination systems using LEDs along with various materials to convert the light emitted from the LEDs.

2. Description of Related Art

Light emitting diodes (LEDs) are becoming a viable alternative to conventional light sources in many applications. For years, LEDs were used as indicator lights because of their long life, reliability and energy efficiency. Most recently, LEDs have been making a big impact in the field of illumination. LEDs have been exponentially increasing in brightness over the years, leading to their acceptance into the field of illumination.

While many LEDs provide nearly 100,000 hours of performance, white LEDs have significantly shorter lives. Both the expected lifetime and the lumen maintenance over the lifetime are significantly reduced compared to conventional non-white high brightness LEDs. There may be several reasons for this drop-off in performance. The white LED package uses a blue or ultraviolet die to pump an active phosphor impregnated in the die, package or epoxy used in the package of the LED to produce white light. The phosphor converts the blue or ultraviolet wavelengths produced by the die into a white light. The die itself usually produces a rather narrow spectrum of blue light and the phosphor down converts this energy to longer wavelength energy. The resulting spectrum is shifted from the narrow blue towards the middle of the visible spectrum and the spectrum is typically broadened. White LEDs are available through companies such as Nichia. Because of imperfections in this down conversion, the white LEDs produce a very blue-white light meaning the color temperature of the illumination and the quality of the light is not acceptable for many general illumination applications.

SUMMARY

In various embodiments, methods and systems are provided for improved white light LED systems. In an embodiment, the present invention is an apparatus for providing an efficient, computer-controlled, multicolored illumination network capable of high performance and rapid color selection and change.

An embodiment of an illumination system may include a first LED and a carrier material. The carrier material may be comprised of plastic, synthetic material, polymer, latex, rubber or other material. The carrier material includes a phosphor, fluorescent material, organic fluorescent material, inorganic fluorescent material, impregnated phosphor, phosphor particles, phosphor material, YAG:Ce phosphor, or other material which can convert electromagnetic radiation into illumination and/or visible light. The illumination system may also have a housing wherein the housing has an open end. The first LED may be arranged to project emitted light through the open end and the carrier material may be cooperatively arranged with the housing such that the emitted light from the first LED is projected through the carrier material.

Another embodiment of an illumination system may include a first LED and a carrier material. The carrier material may be comprised of plastic, synthetic material, polymer, latex, rubber or other material. The carrier material may also contain a phosphor, fluorescent material, organic fluorescent material, inorganic fluorescent material, impregnated phosphor, phosphor particles, phosphor material, YAG:Ce phosphor, or other material which can convert electromagnetic radiation into illumination and/or visible light. The illumination system may also include a housing wherein the housing may be made of a transparent material, translucent material, semi-transparent material, semi-translucent material or other material capable of at least partial transmission of electromagnetic radiation. The LED may be arranged to project emitted light through the housing. The carrier material may be cooperatively arranged with the housing such that the emitted light from the first LED is projected through the material.

Another embodiment of an illumination system may include a first LED and a housing. The housing may be formed from a carrier material; wherein the material comprises plastic, synthetic, polymer, latex, rubber or other material. The carrier material may further comprise a phosphor, fluorescent material, organic fluorescent material, inorganic fluorescent material, impregnated phosphor, phosphor particles, phosphor material, YAG:Ce phosphor, or other material which can convert electromagnetic radiation into illumination and/or visible light. The LEDs may be arranged to project emitted light through the housing.

Another embodiment of an illumination system may include a second LED wherein the second LED produces a different spectral distribution from the first LED. The second LED may produce amber light, yellow light, red light, or any other light or electromagnetic radiation.

Yet another embodiment of an illumination system may include two different colored LEDs and a housing. The housing may comprise a transparent material, translucent material, semi-transparent material, semi-translucent material, or other material capable of at least partial transmission of electromagnetic radiation. The two different colored LEDs may be arranged to project light through the housing. A carrier material comprising plastic, synthetic, polymer, latex, rubber or other material may be associated with the housing. The carrier material may further comprise a phosphor fluorescent material, organic fluorescent material, inorganic fluorescent material, impregnated phosphor, phosphor particles, phosphor material, YAG:Ce phosphor or other material which can convert electromagnetic radiation into illumination and/or visible light. The first material may be selectively arranged in cooperation with the housing such that the light produced by one of the two LEDs is projected through the carrier material and light produced by one of the two LEDs is projected from the illumination system without passing through the carrier material.

At least one of the two LEDs in an embodiment may produce blue light, violet light, ultraviolet light or other light or electromagnetic radiation. At least one of the two LEDs in an embodiment may produce amber light, yellow light, red light or other light.

In an embodiment, one of the LEDs may produce short-wavelength light. The short-wavelength LED produces may produce blue light, violet light, ultraviolet light or other short-wavelength light. The carrier material may be selectively arranged in strips such that the light from the short-wavelength LED is projected through the first material.

The carrier material may alternatively be selectively arranged as a continuous sheet with holes such that the light from the short-wavelength LED is projected through the carrier material.

The system may comprise a first carrier material and a second material. The first carrier material may be comprised of plastic, synthetic, polymer, latex, rubber or other material. The first material may further comprise a phosphor, fluorescent material, organic fluorescent material, inorganic fluorescent material, impregnated phosphor, phosphor particles, phosphor material, YAG:Ce phosphor or other material which can convert electromagnetic radiation into illumination and/or visible light. The second carrier material may be comprised of plastic, synthetic, polymer, latex, rubber or other material. The second material may further comprise a phosphor, fluorescent material, organic fluorescent material, inorganic fluorescent material, impregnated phosphor, phosphor particles, phosphor material, YAG:Ce phosphor or other material which can convert electromagnetic radiation into illumination and/or visible light. The second carrier material may be different than the first carrier material. The first carrier material may be selectively arranged such that the light from at least one of the short-wavelength LED is projected through the first carrier material; and wherein the second carrier material may be selectively arranged such that the light from the short-wavelength LED is projected through the second carrier material.

Another embodiment is directed to a linear lighting apparatus, comprising a plurality of light emitting diodes disposed in a substantially linear arrangement and configured to emit, when energized, at least first radiation having a first spectrum. The linear lighting apparatus also comprises at least one conversion material having a substantially linear form and arranged with respect to the plurality of light emitting diodes such that at least some of the first radiation impinges upon the at least one conversion material. In one aspect, the at least one conversion material is configured to convert at least one frequency component of the first spectrum so as to provide to an observer of the linear lighting apparatus visible light having a converted spectrum different than the first spectrum.

In any of the above embodiments the first LED may emit blue light, violet light, ultraviolet light or other light. The first LED may emit a peak wavelength of approximately 480 nm in one embodiment or any wavelength(s) less than 550 nm in another embodiment. In an embodiment of the invention, the linear lighting apparatus is configured to resemble a conventional neon lighting apparatus. In an embodiment of the invention, the housing is configured to resemble a conventional neon lighting apparatus housing. The housing may form an elongate housing coupled to the plurality of LEDs, a reflector housing, linear lamp housing, cove housing, MR16 housing, C-Series housing, ColorBlast housing, a lighting fixture housing, or other housing. Some housings which may be used are described in U.S. patent application Ser. No. 09/669,121 for "Multicolored LED Lighting Method and Apparatus," U.S. Patent application Ser. No. 60/235,966 for "Optical System for Light-Emitting Semiconductors," U.S. patent application Ser. No. 09/333,739 for "Diffuse Illumination Systems and Methods," U.S. Patent application Ser. No. 29/138,407 for "Lighting Fixture," U.S. patent application Ser. No. 09/215,624 for "Smart Light Bulb," and U.S. patent application Ser. No. 09/805,368 for "Light-emitting Diode based products." The entire disclosures of each of these applications is incorporated herein by reference.

BRIEF DESCRIPTION OF THE DRAWINGS

The following figures depict certain illustrative embodiments of the invention which like reference numerals refer to like elements. These depicted embodiments are be understood as illustrative of the invention and not as limiting in any way.

DETAILED DESCRIPTION

Figure 1:
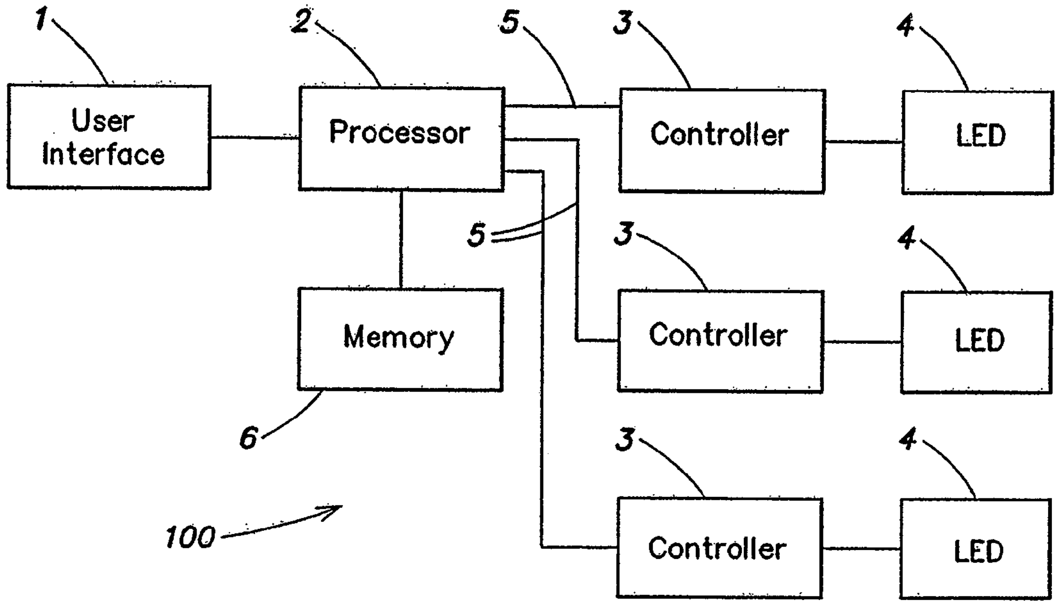
FIG. 1 depicts an exemplary lighting system.

The description below pertains to several illustrative embodiments of the invention. Although many variations of the invention may be envisioned by one skilled in the art, such variations and improvements are intended to fall within the compass of this disclosure. Thus, the scope of the invention is not to be limited in any way by the disclosure below.

As used herein, the term "LED" means any system that is capable of receiving electrical signal and producing a color of light in response to the signal. Thus, the term "LED" should be understood to include light emitting diodes of all types, light emitting polymers, semiconductor dies that produce light in response to current, organic LEDs, electro-luminescent strips, and other such systems. In an embodiment, an "LED" may refer to a single light emitting diode having multiple semiconductor dies that are individually controlled. It should also be understood that the term "LED" does not restrict the package type of the LED. The term "LED" includes packaged LEDs, nonpackaged LEDs, surface mount LEDs, chip on board LEDs and LEDs of all other configurations. The term "LED" also includes LEDs packaged or associated with phosphor wherein the phosphor may convert energy from the LED to a different wavelength.

An LED system is one type of illumination source. As used herein "illumination source" should be understood to include all illumination and/or light sources, including LED systems, as well as incandescent sources, including filament lamps, pyroluminescent sources, such as flames, candle-luminescent sources, such as gas mantles and carbon arch radiation sources, as well as photo-luminescent sources, including gaseous discharges, fluorescent sources, phosphorescence sources, lasers, electro-luminescent sources, such as electro-luminescent lamps, light emitting diodes, and cathode luminescent sources using electronic satiation, as well as miscellaneous luminescent sources including galvano-luminescent sources, crystallo-luminescent sources, kine-luminescent sources, thermo-luminescent sources, triboluminescent sources, sonoluminescent sources, and radioluminescent sources. Illumination sources may also include luminescent polymers capable of producing primary colors.

The term "illuminate" should be understood to refer to the production of a frequency of radiation by an illumination source. The term "color" should be understood to refer to any frequency of radiation within a spectrum; that is, a "color," as used herein, should be understood to encompass a frequency or combination of frequencies not only of the visible spectrum, but also frequencies in the infrared and ultraviolet areas of the spectrum, and in other areas of the electromagnetic spectrum.

There have been significant advances in the control of LEDs. U.S. patents in the field of LED control include Ser. Nos. 6,016,038, 6,150,774, and 6,166,496. U.S. patent application Ser. No. 09/716,819 for "Systems and Methods for Generating and Modulating Illumination Conditions" also describes, among other things, systems and controls. The entire disclosure of all these documents is herein incorporated by reference.

One embodiment of U.S. patent application Ser. No. 09/716,819 teaches of combining white LEDs with LEDs of different colors to produce a high quality white light with acceptable and/or alterable color temperature. One embodiment also teaches of modulating the power to at least one of the LEDs in the illumination system for controlling the color temperature of the light. This can, for example, be useful for modulating the illumination conditions within a room. This could be used to change the color temperature in a room from a warm sunrise color in the morning through a cooler noontime color and back to an evening sunset condition.

FIG. 1 illustrates a block diagram of one embodiment of an illumination system 100. A processor 2 is associated with several controllers 3. The controllers 3 control the power to the LEDs 4. As used herein, the term processor may refer to any system for processing electronic signals. A processor may include a microprocessor, microcontroller, programmable digital signal processor, other programmable device, a controller, addressable controller, microprocessor, microcontroller, addressable microprocessor, computer, programmable processor, programmable controller, dedicated Processor, dedicated controller, integrated circuit, control circuit or other processor. A processor may also, or instead, include an application specific integrated circuit, a programmable gate array, programmable array logic, a programmable logic device, a digital signal processor, an analog-to-digital converter, a digital-to-analog converter, or any other device that may be configured to process electronic signals. In addition, a processor may include discrete circuitry such as passive or active analog components including resistors, capacitors, inductors, transistors, operational amplifiers, and so forth, as well as discrete digital components such as logic components, shift registers, latches, or any other separately packaged chip or other component for realizing a digital function. Any combination of the above circuits and components, whether packaged discretely, as a chip, as a chipset, or as a die, may be suitably adapted to use as a processor as described herein. It will further be appreciated that the term processor may apply to an integrated system, such as a personal computer, network server, or other system that may operate autonomously or in response to commands to process electronic signals such as those described herein. Where a processor includes a programmable device such as the microprocessor or microcontroller mentioned above, the processor may further include computer executable code that controls operation of the programmable device. In an embodiment, the processor 2 is Microchip PIC processor 12C672 and the LEDs 4 may be red, green and blue.

The controller 3 may be a pulse width modulator, pulse amplitude modulator, pulse displacement modulator, resistor ladder, current source, voltage source, voltage ladder, switch, transistor, voltage controller, or other controller. The controller controls the current, voltage or power through the LED 4. The controller also has a signal input wherein the controller is responsive to a signal received by the signal input. The signal input is associated with the processor such that the processor communicates signals to the signal input and the controller regulates the current, voltage and or power through the LED. In an embodiment, several LEDs with different spectral output may be used. Each of these colors may be driven through separate controllers. The processor and controller may be incorporated into one device. This device may power capabilities to drive several LEDs in a string or it may only be able to support one or a few LEDs directly. The processor and controller may also be separate devices. By controlling the LEDs independently, color mixing can be achieved for the creation of lighting effects. In an embodiment, memory 6 is also be provided. The memory 6 is capable of storing algorithms, tables, or values associated with the control signals. The memory 6 may store programs for controlling the LEDs 4. The memory may be memory, read-only memory, programmable memory, programmable read-only memory, electronically erasable programmable read-only memory, random access memory, dynamic random access memory, double data rate random access memory, Rambus direct random access memory, flash memory, or any other volatile or non-volatile memory for storing program instructions, program data, address information, and program output or other intermediate or final results. A program, for example, may store control signals to operate several different colored LEDs 4. A user interface 1 may also be associated with the processor 2. The user interface may be used to select a program from memory, modify a program from memory, modify a program parameter from memory, select an external signal or provide other user interface solutions. Several methods of color mixing and pulse width modulation control are disclosed in U.S. Pat. No. 6,016,038 "Multicolored LED Lighting Method and Apparatus," the entire disclosure of which is incorporated by reference herein. The processor 2 can also be addressable to receive programming signals addressed to it.

Another useful interface is an interface that is associated with a power source. An energy storage element can be associated with a power source. The energy storage device cart also be associated with a processor. The energy storage element may be a capacitor, non-volatile memory, battery backed memory, relay, storage device or other energy storage element. The element may communicate a logic high and a logic low signal to the processor depending on the state of the element. For example, the element may communicate a low logic signal when the device is connected to the power source and a high logic signal when the device is disconnected from the power source. The high logic signal may change to a low logic signal following a predetermined period of time and the processor may be monitoring the signal. The lighting device could be programmed such that a last lighting program may be operating when the device is de-energized. If the device is re-energized within a predetermined period, while the logic signal is still high, the device may select a new program from memory to execute. If the device is not re-energized within the predetermined period, the device may start up in the last lighting program or a default program or vice-versa. A non-volatile memory, battery backed memory or other memory may be provided such that the last program is remembered. The technique can be used to change the program, a program parameter or other setting. This technique can be used in a device that does not include a separate user interface by turning the power to the lighting device off and on. A separate switch could also be employed to provide the user interface as well as an on/off switch.

As used herein the term "convert" shall mean a process method, or similar thing that changes the properties of the electromagnetic radiation generated by illumination source. This process may also be generally referred to as down converting. This process is generally used to describe an active phosphor as in a fluorescent lamp for example. The phosphor coating on a fluorescent lamp converts (or down converts) the ultraviolet energy produced by the mercury discharge into visible light. Different phosphors can be combined into one mixture such that several different conversion processes occur simultaneously. Many fluorescent lamps use three phosphors or a tri-phosphor to convert the ultraviolet light into three different spectral power distributions. This conversion generally results in the ultraviolet light appearing as "white light" in the visible spectrum.

Converting within this disclosure can be from any wavelength(s) of electromagnetic radiation into any other wavelength(s) of electromagnetic radiation including the same wavelength(s).

An illumination system 200 according to the principles of the invention may include a carrier material 204. The system 200 may also include a system 100 with one or more LEDs 4. The carrier material 204 may be arranged such that illumination from an LED 4 is projected through the carrier material 204. The carrier material is designed to convert the light received into a different spectral power distribution. The LED spectral power distribution may be narrow and the carrier material 204 may be used to shift the spectra and/or broaden the spectral power distribution or otherwise change the spectral power distribution. The carrier material 204 may be made of plastic, synthetic material, polymer, latex, rubber or other material. The carrier material 204 may also be comprised of a phosphor, fluorescent material, organic fluorescent material, inorganic fluorescent material, impregnated phosphor, phosphor particles, phosphor material, YAG:Ce phosphor, or other material to convert the electromagnetic radiation projected from the LED or other illumination source into illumination and/or visible light. Combinations of the above carrier material 204 or material to convert are also included an embodiment of the invention. One possible carrier material with these properties can be purchased from ARI International, 2015 S. Arlington Heights, Ill. 60005. ARI International has a rubber-based product referred to as White Cap. ARI International offers several different materials to convert the light from a blue LED into several different colors.

Figure 2:
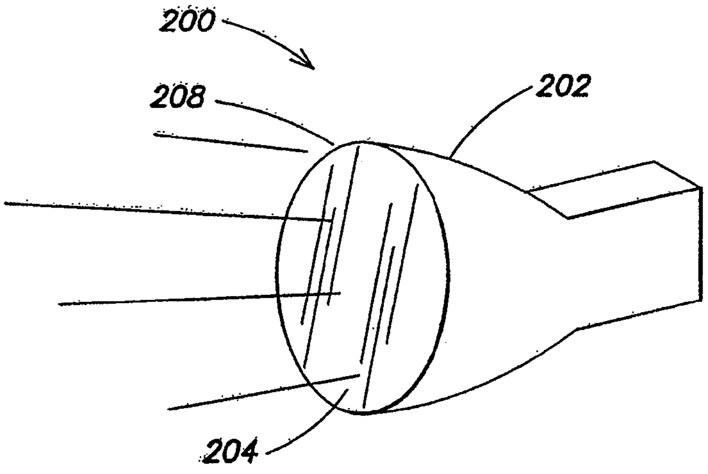
FIG. 2 illustrates an embodiment of an illumination system.
Figure 7:
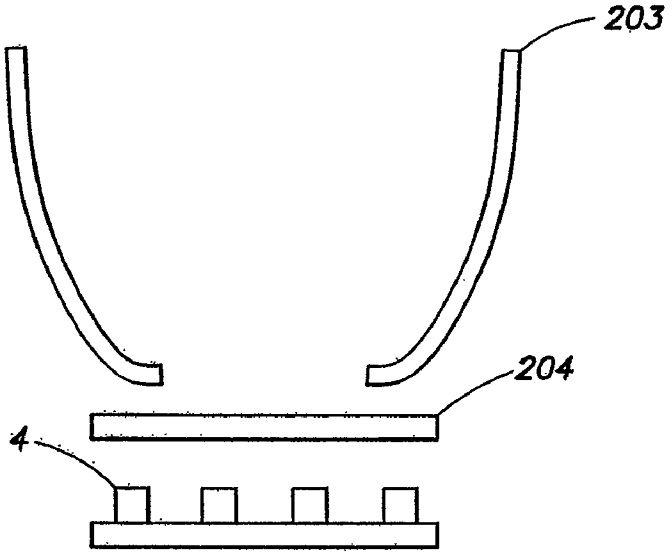
FIG. 7 shows another embodiment of an illumination system.

The illumination system may also comprise a housing 202. The housing 202 may be designed to house the LED system 100. The carrier material 204 may be cooperatively arranged with the housing such that the illumination from at least one of the LEDs passes through the carrier material 204. FIG. 2 illustrates a configuration according to the principles of the invention where the carrier material 204 is placed over the exit aperture or open end 208 of the housing. FIG. 7 illustrates another configuration according to the principles of the invention where the carrier material 204 is placed over the inlet to a reflector 203. The carrier material 204 can be arranged in any position such that the illumination from any of the LEDs passes through the carrier material.

Figure 3:
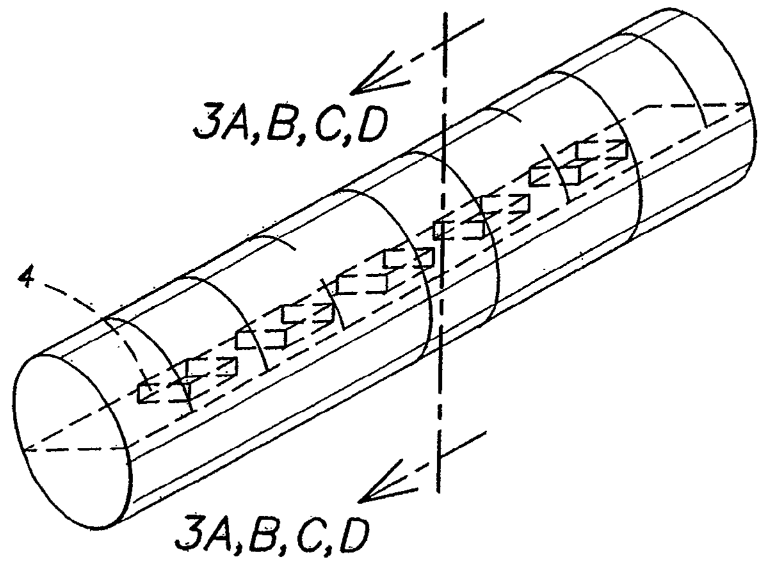
FIG. 3 shows an embodiment of an illumination system with alternative sectional views.
Figure 3A:
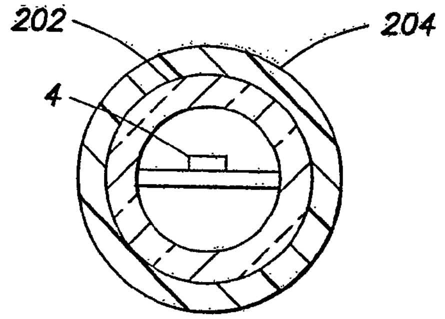
FIGS. 3A, 3B, 3C, and 3D show cross sectional view of the embodiment of FIG. 3 at the line A-A.
Figure 3B:
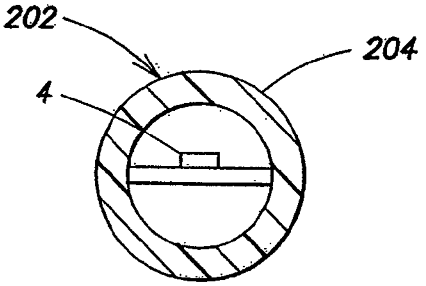
Figure 3C:
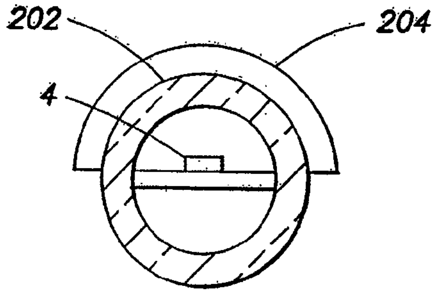
Figure 3D:
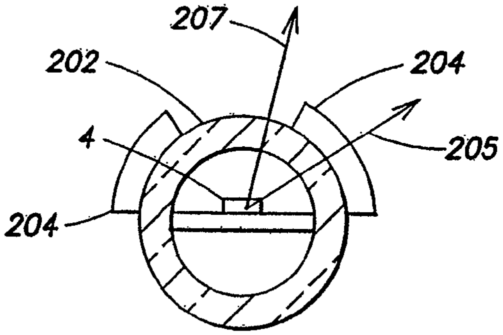

FIGS. 3, 3A, 3B, 3C, and 3D illustrate various configurations of an illumination system according to the principles of the invention. This system includes a housing 202 wherein the LEDs 4 are substantially contained. In this configuration, the housing is elongate and is coupled to the plurality of LEDs and the LED illumination is projected through the housing 202. The housing 202 may be made of a transparent material, translucent material, semi-transparent material, semi-translucent material, or other material designed to allow for the transmission or partial transmission of electromagnetic radiation. A carrier material 204 may be cooperatively associated with the housing 202 such that the electromagnetic radiation emitted from at least one of the LEDs passes through the carrier material 204. For example, FIG. 3A shows the carrier material 204 enclosing the housing 202. FIG. 3C shows a system where the carrier material 204 is selectively arranged to cover a portion of the housing. FIG. 3B shows another alternative example where the housing 202 is formed of the carrier material 204. FIG. 3D shows another example where the carrier material is selectively arranged to cover a portion of the housing. With this arrangement, some of the light 205 from an LED may be converted while some of the light 207 from the LED may not be converted.

Figure 4:
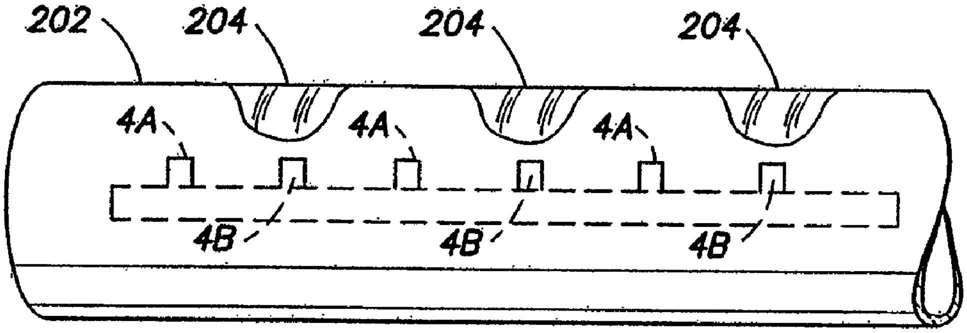
FIG. 4 depicts an embodiment of an illumination system with selectively arranged material.

FIG. 4 illustrates another exemplary illumination system where the carrier material 204 is selectively arranged. The carrier material 204 may cover or be formed in sections of the housing while not covering other sections. For instance, "holes" or openings may be left in the carrier material 204 to reveal housing 202 or so that there is no carrier material at the "hole." This arrangement may be designed to allow the carrier material 204 to cover certain LEDs while allowing other LEDs to project light without passing through the carrier material. A useful example of this arrangement could be where at least two different colored LEDs are provided in the illumination system. The LEDs may be alternating blue 4B and amber 4A for example. The blue LEDs 4B may be arranged to project illumination through the carrier material 204 and the amber LEDs 4A may be arranged to project illumination through the housing 202 and/or hole without passing through the carrier material 204. This arrangement could be useful for producing a different color temperature light or variable color temperature light or other lighting effects. U.S. patent application Ser. No. 09/716,819 describes some methods of modulating illumination conditions which could be used for such radiation and the entire disclosure is hereby incorporated by reference herein. The system could be controlled such that the intensity of each of the colors within the system could be modulated to change the illumination conditions produced by the system. For example, the blue LED may be driven at a high level and the amber LED power may be varied. The light projected from the several LEDs combines and this technique can be used to change the overall color of the system. In this example, the carrier material 204 is used to convert the blue LED radiation to white radiation and the amber LED is used to lower the color temperature of the resultant radiation. It will be obvious to one of ordinary skill in the art that there are many combinations of LEDs that could be used to produce useful colors, illumination, and changing illumination effects. Some of these are also disclosed in the above referenced U.S. patent application Ser. No. 09/716,819.

Figure 5:
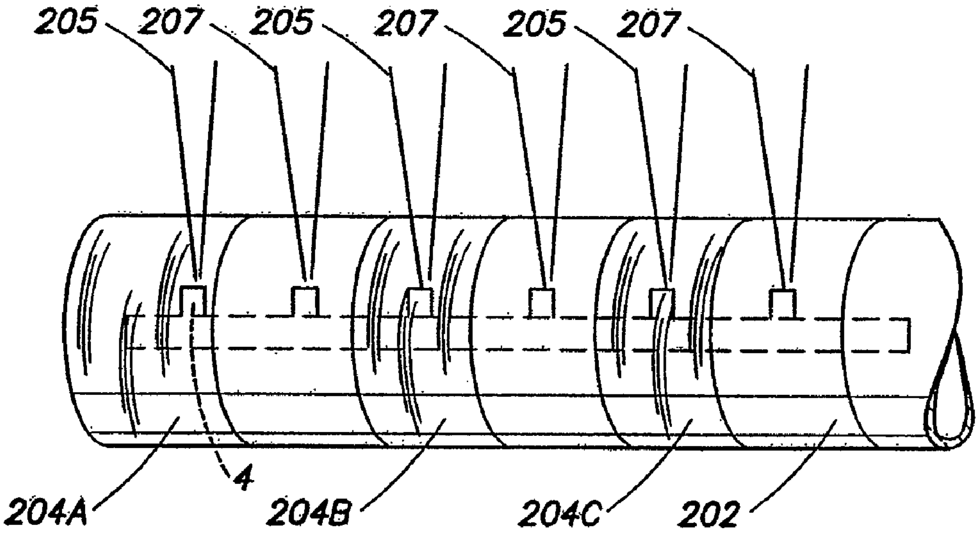
FIG. 5 illustrates an embodiment of an illumination system with selectively arranged material.

Another configuration of a system according to the principles of the invention is illustrated in FIG. 5. The carrier material 204 is selectively arranged in strips 204A, 204B, 204C, etc., to cover portions of the housing 202. The strips 204A, 204B, 204C, etc., may be arranged such that the illumination from at least one of the LEDs is projected through the carrier material 204.

Figure 6:
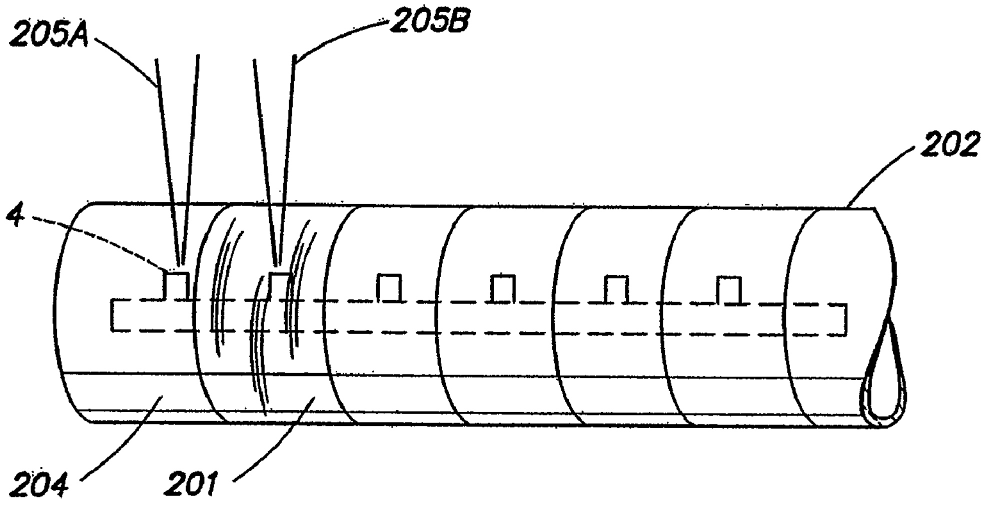
FIG. 6 illustrates an embodiment of an illumination system with two different types of material.

Another useful embodiment according to the principles of the invention is depicted in FIG. 6. In this example, the illumination system is using two or more different types of carrier materials 201 and 204. The LEDs 4 may produce the same color or they may be different colors 205A and 205B. Providing a system with one or more LEDs of the same color can be useful. For example, if a blue LED is provided along with two different carrier materials, the light projected through the two different carrier materials will produce two different colors. One carrier material may produce a high color temperature white light while the other carrier material produces a low color temperature white light. The illumination from the system would produce a combined color temperature from the two carrier materials and allow for control over the color temperature. A system with two blue LEDs, for example, along with two different types of material may be useful for producing a combined color from the system. The illumination conditions could also be adjusted by modulating the power of the separate LEDs. Through this modulation, the light emitted through one or more of the carrier materials can be changed to change the overall color emitted from the system. It should be appreciated that two or more different carrier materials may be arranged in a variety of manners not limited to the particular example illustrated in FIG. 6.

In yet another embodiment of the invention, illumination systems having three or more colors of LEDs could be generated with any number of these LEDs having their illumination converted by one or more types of carrier material 204. The principles of building such a system extend from the above examples and would be understood by one of skill in the art.

In another configuration there can be partitions, reflectors or other dividers separating LEDs so that light from any single LED can be directed at a particular location such as carrier material 204, housing 202 or a hole while limiting spill from the LED into the other locations.

All articles, patents, and other references set forth above are hereby incorporated by reference. While the invention has been disclosed in connection with the embodiments shown and described in detail, various equivalents, modifications, and improvements will be apparent to one of ordinary skill in the art from the above description. Such equivalents, modifications, and improvements are encompassed herein.

The invention claimed is:

1. A linear lighting apparatus, comprising:

a plurality of light emitting diodes (LEDs) disposed in a substantially linear arrangement and configured to emit, when energized, at least first radiation having a first spectrum; and at least one conversion material having a substantially linear form and arranged with respect to the plurality of light emitting diodes such that at least some of the first radiation impinges upon the at least one conversion material, wherein the at least one conversion material is configured to convert at least one frequency component of the first spectrum so as to provide to an observer of the linear lighting apparatus visible light having a converted spectrum different than the first spectrum;

wherein the plurality of LEDs comprise at least one first LED and at least one second LED, and wherein the at least one first LED and at least one second LED are configured to emit, when energized, at least the first radiation having the first spectrum and second radiation having a second spectrum different than the first spectrum, respectively;

said plurality of LEDs extending linearly within an elongate housing having a conversion material;

said elongate housing coupled to said plurality of LEDs and retaining said

LEDs within said housing and emitting light through said elongate housing;

wherein the housing is configured to at least partially enclose the plurality of LEDs, and wherein the housing and the at least one conversion material are cooperatively arranged such that at least the first radiation impinges upon a first side of the at least one conversion material and the visible light is provided on a second side of the at least one conversion material.

2. The linear lighting apparatus of claim 1, wherein said elongate housing is tubular in configuration.

3. The linear lighting apparatus of claim 1, wherein:

at least some of the plurality of LEDs are disposed within a curved substantially linear arrangement of said elongate housing; and at least a portion of the at least one conversion material has a curved substantially linear form corresponding to the curved substantially linear arrangement of said elongate housing.

4. The linear lighting apparatus of claim 1, wherein the at least one conversion material is substantially translucent and includes at least one of a polymeric material, a phosphorescent material, and a fluorescent material.

5. The linear lighting apparatus of claim 4, wherein the at least one conversion material includes at least one of latex and rubber.

6. The linear lighting apparatus of claim 4, wherein the at least one conversion material includes at least one phosphor-doped material.

7. The linear lighting apparatus of claim 4, wherein the at least one conversion material includes a YAG:Ce phosphor.

8. The linear lighting apparatus of claim 1, further comprising at least one controller configured to independently control a first intensity of the first radiation and a second intensity of the second radiation so as to vary the converted spectrum of the visible light provided by the linear lighting apparatus.

9. The linear lighting apparatus of claim 1, wherein the at least one conversion material is arranged with respect to the plurality of light emitting diodes such that at least some of the first radiation and the second radiation impinges upon the at least one conversion material.

10. The linear lighting apparatus of claim 9, wherein the at least one conversion material is configured to convert the at least one frequency component of the first spectrum and at least one frequency component of the second spectrum so as to provide to the observer of the linear lighting apparatus the visible light having the converted spectrum.

11. The linear lighting apparatus of claim 10, further comprising at least one controller configured to independently control a first intensity of the first radiation and a second intensity of the second radiation so as to vary the converted spectrum of the visible light provided by the linear lighting apparatus.

12. The apparatus of claim 4, wherein the at least one conversion material includes at least one of an impregnated phosphor and phosphor particles.

13. The apparatus of claim 1, wherein said housing and the at least one conversion material are cooperatively arranged such that at least the first radiation impinges upon a first side of the at least one conversion material and the visible light is provided on a second side of the at least one conversion material.

14. The apparatus of claim 1, wherein the at least one conversion material is integrated with at least a portion of the housing so as to form part of the housing itself.

15. The apparatus of claim 1, further comprising at least one controller configured to independently control a first intensity of the first radiation and a second intensity of the second radiation so as to vary the converted spectrum of the visible light provided by the linear lighting apparatus.

16. The apparatus of claim 15, wherein the at least one controller is configured to independently control the first intensity of the first radiation and the second intensity of the second radiation such that the visible light includes substantially white light having a variable color temperature.

17. The apparatus of claim 1, wherein:

the at least one first LED includes at least one blue LED; and the at least one conversion material is configured to alter only the first spectrum.

18. The apparatus of claim 17, wherein the at least one second LED includes at least one amber LED.

19. The apparatus of claim 1, wherein the at least one conversion material includes a first conversion material and a second conversion material different from the first conversion material, and wherein one of the first radiation and the second radiation selectively interacts with the first conversion material.

20. The apparatus of claim 19, wherein the first and second different conversion materials are arranged with respect to the at least one first LED and the at least one second LED such that the one of the first radiation and the second radiation, when generated, impinges upon at least the first conversion material.

21. The apparatus of claim 1, wherein the at least one conversion material is associated with only a portion of the housing and arranged with respect to the at least one first LED and the at least one second LED such that only one of the first radiation and the second radiation, when generated, substantially interacts with the at least one conversion material.

22. The linear lighting apparatus of claim 1, further comprising at least one reflector disposed proximate to the at least one conversion material and/or the plurality of LEDs.

23. The linear lighting apparatus of claim 22, wherein the at least one conversion material is placed over an inlet to the at least one reflector.

24. The linear lighting apparatus of claim 1, further comprising at least one of:

at least one partition;

at least one reflector; and at least one divider, for directing at least a portion of the first radiation to a particular location on the at least one conversion material.

25. A lighting method, comprising acts of:

A) disposing a plurality of light emitting diodes (LEDs) in a substantially linear arrangement within a tubular housing, said tubular housing having a translucent side wall, each of said LEDs positioned centrally within said tubular housing and substantially equidistant from said translucent side wall;

B) generating at least first radiation having a first spectrum from the plurality of LEDs and generating second radiation having a second spectrum from the plurality of LEDs which are different than the first spectrum;

C) arranging at least one conversion material having a substantially linear form with respect to the plurality of LEDs on said translucent side wall of said tubular housing such that the first radiation, when generated, substantially interacts with the conversion material, wherein said plurality of LEDs extending within a substantially tubular elongate housing supporting interiorly said plurality of LEDs such that each of said plurality of LEDs are substantially equally distanced from said conversion material;

irradiating the at least one conversion material with at least some of the first radiation and the second radiation, wherein the at least one conversion material is configured to convert the at least one frequency component of the first spectrum and at least one frequency component of the second spectrum so as to provide the visible light having the converted spectrum;

and

D) irradiating the at least one conversion material with at least some of the first radiation, wherein the at least one conversion material is configured to convert at least one frequency component of the first spectrum so as to provide visible light having a converted spectrum different than the first spectrum;

independently controlling a first intensity of the first radiation and a second intensity of the second radiation so as to vary the converted spectrum of the visible light, such that the visible light includes substantially white light having a variable color temperature.

26. The lighting method of claim 25, wherein the at least one conversion material is substantially translucent and includes at least one of a polymeric material, a phosphorescent material, and a fluorescent material.

27. The lighting method of claim 25, wherein the at least one conversion material includes at least one phosphor-doped material.

28. The lighting method of claim 25, wherein the at least one conversion material includes at least one of an impregnated phosphor and phosphor particles.

29. The lighting method of claim 25, wherein the at least one conversion material includes a YAG:Ce phosphor.

30. The lighting method of claim 25, further comprising an act of: independently controlling a first intensity of the first radiation and a second intensity of the second radiation so as to vary the converted spectrum of the visible light.

31. The lighting method of claim 25, further comprising:

arranging at least one reflector proximate to the at least one conversion material and/or the plurality of LEDs.

32. A linear lighting apparatus, comprising:

a plurality of light emitting diodes (LEDs) disposed in a substantially linear arrangement, the plurality of LEDs including:

at least one first LED configured to emit, when energized, at least first radiation having a first spectrum; and at least one second LED configured to emit, when energized, at least second radiation having a second spectrum;

an elongate tubular housing coupled to the at least one first LED and the at least one second LED, both of said first LED and said second LED positioned within said tubular housing and spacing each of said plurality of LEDs substantially equidistantly from a translucent sidewall of said tubular housing; and at least one conversion material integrated with said tubular housing and having a substantially linear form and arranged with respect to the plurality of light emitting diodes such that at least some of the first radiation impinges upon the at least one conversion material, wherein the at least one conversion material is configured to convert at least one frequency component of the first spectrum so as to provide to an observer of the linear lighting apparatus visible light having a converted spectrum different than the first spectrum;

wherein the at least one conversion material includes a first conversion material, wherein the apparatus further includes a second conversion material different from the first conversion material, and wherein one of the first radiation and the second radiation selectively interacts with the first conversion material.

33. The apparatus of claim 32, wherein at least one of the first conversion material and the second conversion material is integrated with a portion of the housing so as to form part of the housing itself.

34. The apparatus of claim 32, wherein:

the first conversion material is arranged with respect to the at least one first LED such that the first radiation, when generated, impinges upon the first conversion material, the first conversion material configured to change at least one first frequency component of the first spectrum so as to provide a first converted spectrum; and the second conversion material is arranged with respect to the at least one first LED such that the first radiation, when generated, impinges upon the second conversion material, the second conversion material configured to change at least one second frequency component of the first spectrum so as to provide a second converted spectrum different from the first converted spectrum, wherein the at least one first LED includes at least one blue LED, wherein the first conversion material is configured such that the first converted spectrum includes substantially white light having a first color temperature, and wherein the second conversion material is configured such that the second converted spectrum includes substantially white light having a second color temperature lower than the first color temperature.

35. The apparatus of claim 34, wherein the at least one second LED includes at least one amber LED, and wherein the apparatus further comprises:

at least one controller configured to independently control a first intensity of the first radiation and a second intensity of the second radiation.

36. The apparatus of claim 32, further comprising at least one reflector disposed proximate to the at least one conversion material and/or the plurality of LEDs.

37. The apparatus of claim 36, wherein the at least one conversion material is placed over an inlet to the at least one reflector.

38. The apparatus of claim 32, further comprising at least one of:

at least one partition;

at least one reflector; and at least one divider, for directing at least a portion of the first radiation and/or the second radiation to at least one particular location on the at least one conversion material and/or the housing.

* * * * *